United States Patent
Horikiri et al.

(10) Patent No.: US 9,406,867 B2
(45) Date of Patent: Aug. 2, 2016

(54) METHOD FOR MANUFACTURING A PIEZOELECTRIC FILM WAFER, PIEZOLELECTRIC FILM ELEMENT, AND PIEZOELECTRIC FILM DEVICE

(75) Inventors: Fumimasa Horikiri, Nagareyama (JP); Kenji Shibata, Tsukuba (JP); Kazufumi Suenaga, Tsuchiura (JP); Kazutoshi Watanabe, Tsuchiura (JP); Akira Nomoto, Kasumigaura (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 682 days.

(21) Appl. No.: 13/137,689

(22) Filed: Sep. 2, 2011

(65) Prior Publication Data
US 2012/0056508 A1 Mar. 8, 2012

(30) Foreign Application Priority Data
Sep. 6, 2010 (JP) ................. 2010-198918

(51) Int. Cl.
- C23F 1/00 (2006.01)
- H01L 41/332 (2013.01)
- H01L 41/08 (2006.01)
- H01L 41/187 (2006.01)
- H01L 41/314 (2013.01)
- H01L 41/316 (2013.01)
- H01L 41/318 (2013.01)

(52) U.S. Cl.
CPC .......... *H01L 41/332* (2013.01); *H01L 41/0805* (2013.01); *H01L 41/1873* (2013.01); *H01L 41/314* (2013.01); *H01L 41/316* (2013.01); *H01L 41/318* (2013.01); *Y10T 428/24479* (2015.01)

(58) Field of Classification Search
None
See application file for complete search history.

(56) References Cited

U.S. PATENT DOCUMENTS

| 5,174,857 | A | * | 12/1992 | Sung | ............................... | 216/48 |
| 5,225,888 | A | * | 7/1993 | Selwyn et al. | ................ | 356/454 |
| 5,591,300 | A | * | 1/1997 | Schiller | ........................... | 438/16 |
| 5,985,092 | A | * | 11/1999 | Chiu et al. | ............... | 156/345.25 |

(Continued)

FOREIGN PATENT DOCUMENTS

| JP | H8-124904 | 5/1996 |
| JP | 2001-110788 | 4/2001 |

(Continued)

OTHER PUBLICATIONS

Kang et al, Etching Characteristics of (Na0.5K0.5)NbO3 Thin Films in an Inductively Coupled Cl2/Ar Plasma), 2007, Taylor and Francis, Ferroelectrics vol. 357, Issue 1, Abstract.*

(Continued)

*Primary Examiner* — Binh X Tran
*Assistant Examiner* — David Cathey, Jr.
(74) *Attorney, Agent, or Firm* — McGinn IP Law Group PLLC

(57) ABSTRACT

A method for manufacturing a piezoelectric film wafer includes an etching step for carrying out a dry etching on a piezoelectric film formed on a substrate by using a gas containing Ar, and a step of changing a rate of the dry etching by detecting a change in an emission peak intensity of Na in emitted ion plasma the piezoelectric film. The piezoelectric film is made of an alkali niobate-based perovskite structure expressed in a composition formula $(K_{1-x}Na_x)NbO_3$ ($0.4 \leq x \leq 0.7$).

14 Claims, 7 Drawing Sheets

(56) References Cited

U.S. PATENT DOCUMENTS

| | | |
|---|---|---|
| 6,548,343 B1 | 4/2003 | Summerfelt et al. |
| 7,482,736 B2 | 1/2009 | Ueno et al. |
| 2001/0042291 A1* | 11/2001 | Esashi et al. ............. 29/25.35 |
| 2007/0126313 A1 | 6/2007 | Ueno et al. |
| 2008/0308762 A1 | 12/2008 | Ueno et al. |
| 2009/0096328 A1* | 4/2009 | Shibata et al. ............. 310/346 |
| 2010/0013894 A1 | 1/2010 | Ueno et al. |
| 2010/0156247 A1 | 6/2010 | Shibata et al. |

FOREIGN PATENT DOCUMENTS

| | | |
|---|---|---|
| JP | 2001-244426 | 9/2001 |
| JP | 2001-326999 | 11/2001 |
| JP | 2007-019302 A | 1/2007 |
| JP | 2007-184513 A | 7/2007 |
| JP | 2009-117785 | 5/2009 |

OTHER PUBLICATIONS

Answers Yahoo, Why do the elements potassium and sodium have similar chemical), May 9, 2008, Yahoo, p. 1.*

Kokaze et al, Development of Deposition and Etching Technologies for Piezoelectric Elements for Ferroelectric MEMS), 2007, ULVA, ULVAC technical ournal No. 66E, p. 13-20.*

Notification of Reason(s) for Refusal dated Jan. 21, 2014, with English translation.

C.M. Kang et al "Etching Characteristics of $(Na_{0.5}K_{0.5})NbO_3$ Thin Films in an Inductively Coupled Cl2/Ar Plasma", Ferroelectrics, 357, pp. 179-184 (2007).

* cited by examiner

METHOD FOR MANUFACTURING A PIEZOELECTRIC FILM WAFER, PIEZOLELECTRIC FILM ELEMENT, AND PIEZOELECTRIC FILM DEVICE

The present application is based on Japanese Patent Application No. 2010-198918 filed on Sep. 6, 2010, respectively, the entire contents of which are incorporated herein by reference.

BACKGROUND OF THE INVENTION

1. Field of the Invention

The invention relates to a method for manufacturing a piezoelectric film wafer, a piezoelectric film element and a piezoelectric thin film device.

2. Related Art

A piezoelectric material is processed into various piezoelectric elements in accordance with different purposes, particularly, it has been widely used for functional electronic components such as an actuator for generating deformation by applying voltage or sensor for generating voltage from the deformation of elements in a reverse way, etc.

As the piezoelectric material used for an actuator or a sensor, a lead (Pb)-based dielectric material having large piezoelectric characteristics, especially, $Pb(Zr_{1-x}Ti_x)O_3$-based perovskite-type ferroelectric called as "PZT", has been widely used, and the piezoelectric material is generally formed by sintering oxide which is formed of individual elements.

In recent years, it is desired to develop a piezoelectric material not containing lead from environmental consideration, and thus, potassium sodium niobate (general formula: $(K_{1-x}Na_x)NbO_3$ (0<x<1)), hereinafter referred to as "KNN", etc., has been developed. Since KNN has piezoelectric characteristics comparable to PZT, it is expected as a potential candidate for a Pb-free piezoelectric material. Examples of a lead-free piezoelectric film using this kind of piezoelectric material are proposed in the JP-A 2007-19302 and JP-A 2007-184513. In addition, it is commonly assumed that it is effective to form a film by providing the piezoelectric film with a plane orientation to provide the piezoelectric film having good piezoelectric characteristics. For example, it is studied to provide a piezoelectric film with the orientation by forming the piezoelectric film on a base layer having an orientation.

It is possible to manufacture an inkjet printer head or an angular rate sensor with small environmental burden by forming a Pb-free piezoelectric film as a piezoelectric film. Accordingly, when an actuator or a sensor is manufactured with using the Pb-free piezoelectric film, it is required to process the Pb-free piezoelectric film in a beam shape or a tuning-fork shape. In etching of the Pb-free piezoelectric film, Cl-based reactive gas is used as a reactive gas, e.g. in C. M. Kang et al "Etching Characteristics of $(Na_{0.5}K_{0.5})NbO_3$ Thin Films in an Inductively Coupled $Cl_2/Ar$ Plasma", Ferroelectrics, 357, pp. 179-184 (2007).

SUMMARY OF THE INVENTION

However, when the Pb-free piezoelectric film is processed by means of a reactive ion etching with the Cl-based reactive gas disclosed by Kang et al, a desired etching selectivity of the Pb-free piezoelectric film to a bottom electrode layer cannot be obtained. Consequently, it is hard to apply the Pb-free piezoelectric film to an actuator, a sensor, filter devices or MEMS (Micro Electro Mechanical System) device which require microprocessing (microfabrication) with high-precision. It is considered to manufacture the bottom electrode layer functioning as the base layer to be thick. However, when the film thickness of the bottom electrode layer is increased, there are problems in that the manufacturing cost is increased and that the detachment of the film is caused. Also there are problems in that desired device characteristics cannot be obtained when the Pb-free piezoelectric film is applied to the device, and that it is hard to maintain a high orientation as the base layer so that desired piezoelectric characteristics cannot be obtained.

Accordingly, it is an object of the invention to provide a method for manufacturing a piezoelectric film wafer, a piezoelectric thin film element and a piezoelectric thin film device, in which the microprocessing can be carried out on a piezoelectric film with high precision in a short time.

After zealous studies, the Inventors found that the change in emission peak intensity of Na in ion plasma emitted by the dry etching using a gas containing Ar occurs suddenly in vicinity of an interface between a piezoelectric film and a bottom electrode. Further, it is found that it is possible to carry out the microprocessing on the piezoelectric film with high precision in a short time, by detecting the end of the etching of the piezoelectric film with using the change in the Na emission peak intensity. The present invention is based on the above contemplation of the Inventors.

(1) According to a feature of the invention, a method for manufacturing a piezoelectric film wafer comprises:

an etching step for carrying out a dry etching on a piezoelectric film formed on a substrate by using a gas containing Ar, the piezoelectric film comprising an alkali niobate-based perovskite structure expressed in a composition formula $(K_{1-x}Na_x)NbO_3$ (0.4≤x≤0.7); and a step of changing a rate of the dry etching by detecting a change in an emission peak intensity of Na in emitted ion plasma.

(2) A fall of the emission peak intensity of Na may be detected and a time change in the emission peak intensity of Na may be detected.

(3) The step of changing the rate of the dry etching may comprise a step of stopping the dry etching selectively in a base layer formed between the substrate and the piezoelectric film.

(4) The base layer may comprise a Pt bottom electrode layer.

(5) The etching step may include a reactive ion etching using a mixed gas of the gas containing Ar and a fluorine-based reactive gas.

(6) A mask pattern comprising Ti or Ta may be formed on the piezoelectric film, and the etching step may be carried out by using the mask pattern.

(7) A ratio of a film thickness of the piezoelectric film to a film thickness of the mask pattern is preferably 3 or less, and a ratio of the film thickness of the piezoelectric film to a film thickness of the Pt bottom electrode layer is preferably 15 or less.

(8) According to another feature of the invention, a method for manufacturing a piezoelectric film element comprises:

a step of forming a bottom electrode on a substrate;

a step of forming a piezoelectric film comprising an alkali niobate-based perovskite structure expressed in a composition formula $(K_{1-x}Na_x)NbO_3$ (0.4≤x≤0.7) on the substrate; and a step of carrying out microprocessing on the piezoelectric film by dry etching using a gas containing Ar, the microprocessing step comprising processing the piezoelectric film to have a taper shape which is gradually enlarged toward a surface of the substrate at an etching cross section of the piezoelectric film by stopping processing at the bottom electrode by detecting an attenuation change in an emission peak intensity of a Na emission spectrum within a range from 586 nm to 590 nm in ion plasma.

(9) According to a still another feature of the invention, a piezoelectric film element comprises:

a substrate; and a piezoelectric film comprising an alkali niobate-based perovskite structure expressed in a composition formula $(K_{1-x}Na_x)NbO_3$ (0.4≤x≤0.7) formed on the substrate, the piezoelectric film comprising an etching cross section having a tapered inclined portion which is enlarged toward the outside.

(10) The inclined portion may have a slope angle made by a slope connecting an upper surface edge and a bottom surface edge of the piezoelectric film and a bottom surface of the piezoelectric film, and the slope angle is preferably greater than 45° and smaller than 90°.

(11) A surface of the inclined portion may comprise a fluorine compound.

(12) According to a further feature of the invention, a piezoelectric film device comprises:

a substrate;

a piezoelectric film comprising an alkali niobate-based perovskite structure expressed in a composition formula $(K_{1-x}Na_x)NbO_3$ (0.4≤x≤0.7) formed on the substrate, the piezoelectric film comprising an etching cross section having a tapered inclined portion which is enlarged toward the outside;

a lower electrode provided between the substrate and the piezoelectric film;

an upper electrode provided on the piezoelectric film; and a voltage applying unit or a voltage detecting unit connected to the upper and lower electrodes.

POINTS OF THE INVENTION

According to the invention, a dry etching is carried out on a piezoelectric film comprising an alkali niobate-based perovskite structure expressed in a composition formula $(K_{1-x}Na_x)NbO_3$ (0.4≤x≤0.7) and formed on a substrate by using a gas containing Ar. Further, a rate of the dry etching is changed by detecting a change in an emission peak intensity of Na in emitted ion plasma.

According to this method, it is possible to provide a method for manufacturing a piezoelectric film wafer, a piezoelectric film element, and a piezoelectric film device, in which the microprocessing can be carried out on the piezoelectric film by the dry etching with high precision in a short time.

BRIEF DESCRIPTION OF THE DRAWINGS

Next, the present invention will be explained in more detail in conjunction with appended drawings, wherein.

DESCRIPTION OF THE PREFERRED EMBODIMENTS

Figure 1A:
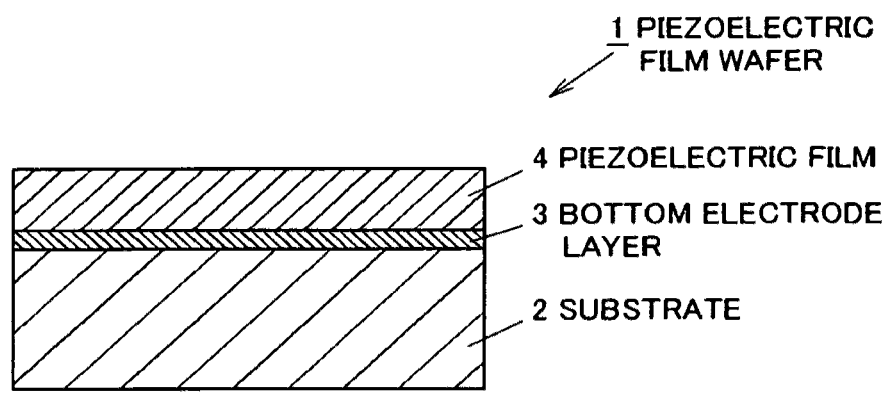
FIG. 1A is a cross sectional view schematically showing a piezoelectric film wafer in a first embodiment according to the present invention.

Hereinafter, preferred embodiments of the present invention will be concretely described in conjunction with appended drawings.

First Embodiment

Structure of a Piezoelectric Film Wafer 1

FIG. 1 schematically discloses a piezoelectric film wafer 1 in the first embodiment according to the present invention. This piezoelectric film wafer 1 comprises a silicon (Si) substrate 2. On an upper surface of the silicon (Si) substrate 2, a bottom electrode layer (a lower electrode layer) 3 as a base layer is formed. This bottom electrode layer 3 comprises a platinum (Pt) film (hereinafter, referred to as "Pt bottom electrode layer 3"). On the Pt bottom electrode layer 3 formed on the Si substrate 2, a piezoelectric film 4 comprising a lead-free (Pb-free) piezoelectric material is formed.

This piezoelectric film 4 is formed of a thin film of an alkali niobate-based perovskite structure represented by a composition formula $(K_{1-x}Na_x)NbO_3$ (hereinafter, referred to as "KNN piezoelectric film 4"). The composition ratio x is 0.4≤x≤0.7. Further, for example, an oxide film (e.g. $SiO_2$ film, not shown) may be formed on the surface of the Si substrate 2 (i.e. between the Si substrate 2 and the Pt bottom electrode layer 3) so as to improve the adhesion between the Si substrate 2 and the Pt bottom electrode layer 3.

Formation of the Bottom Electrode Layer and the Piezoelectric Film

In the microprocessing of the KNN piezoelectric film 4 constituting a part of the piezoelectric film wafer 1 as shown in FIG. 1A, the Pt bottom electrode layer 3 is firstly on the Si substrate 2 by RF magnetron sputtering method. Further, for example, a Ti adhesion layer (not shown) may be formed on the surface of the Si substrate 2 (i.e. between the Si substrate 2 and the Pt bottom electrode layer 3) at the time of forming the Pt bottom electrode layer 3, so as to improve the adhesion between the Si substrate 2 and the Pt bottom electrode layer 3.

Next, the KNN piezoelectric film 4 is formed on the Pt bottom electrode layer 3. When the KNN piezoelectric film 4 is formed on the Pt bottom electrode layer 3 having an arithmetic mean surface roughness Ra greater than 0.86 nm, while the KNN piezoelectric film 4 wears as a piezoelectric device, the piezoelectric characteristic of the KNN piezoelectric film 4 deteriorates. Therefore, so as to obtain a sufficient piezoelectric characteristic of the KNN piezoelectric film 4, it is preferable that the arithmetic mean surface roughness Ra of the Pt bottom electrode layer 3 is 0.86 nm or less.

Formation of a Ti Pattern as a Mask

Next, a Ti film is formed on the KNN piezoelectric film 4 by the RF magnetron sputtering method. Successively, a photoresist is coated on the Ti film, then the photoresist is exposed and developed, to provide a photoresist pattern on the Ti film. The Ti film is etched with a mixed solution of hydrofluoric acid and nitric acid. Thereafter, the photoresist pattern is cleaned by acetone cleansing, to provide a Ti pattern on the KNN piezoelectric film 4. This Ti film is used as an appropriate masking material in the microprocessing of Pb-free piezoelectric film wafer 1. This Ti film has a predetermined etching selectivity to the niobium oxide based piezoelectric film in the present embodiment, so that it is possible to prevent deterioration in pattern accuracy due to the increase in mask thickness during the Ar ion etching.

Processing by Dry Etching

For manufacturing the piezoelectric actuator 100 (shown in FIG. 1B) or the piezoelectric sensor 200 (shown in FIG. 1C) by using the Pb-free piezoelectric film wafer 1 in the present embodiment, the KNN piezoelectric film 4 is formed in a beam shape or a tuning-fork shape by dry etching process to provide element-shaped portions. After forming the element-shaped portions, the element-shaped portions of the Pb-free piezoelectric film wafer 1 are device-singulated (chipped) by dicing or the like to provide piezoelectric film elements. In the microprocessing of this piezoelectric film wafer 1, it is required for conducting the microprocessing with high precision that the KNN piezoelectric film 4 can be processed in a short time and that the processing of the Pt bottom electrode layer 3 can be stopped with good controllability.

Figure 2:
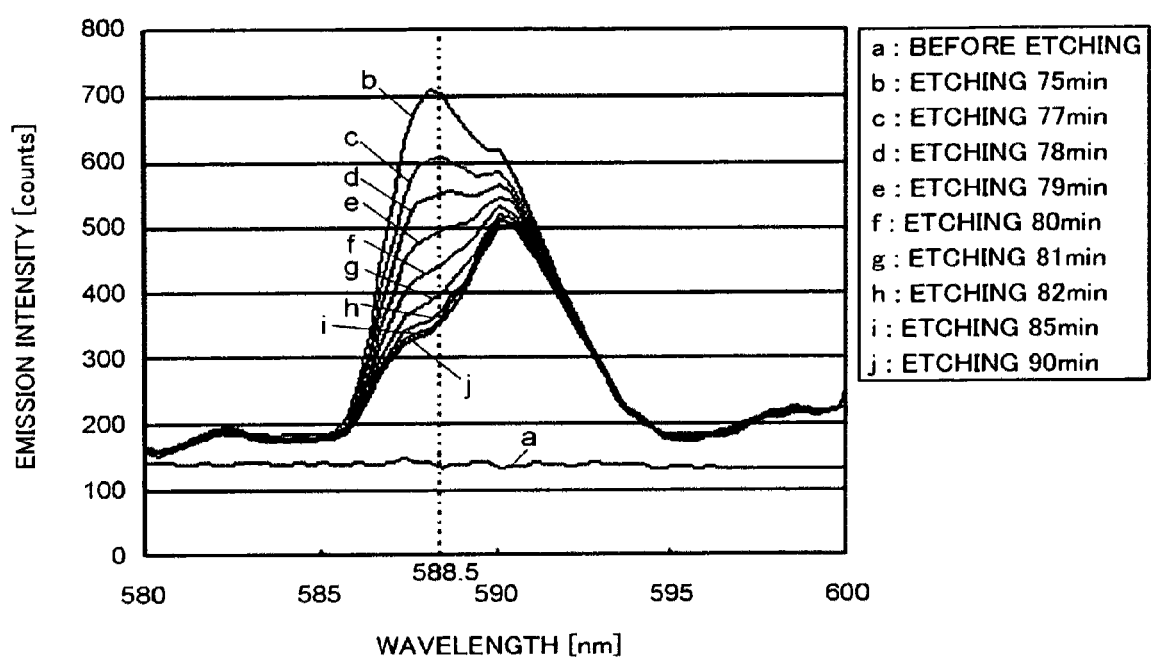
FIG. 2 is a graph showing a time change of Na emission spectrum in dry etching.
Figure 3:
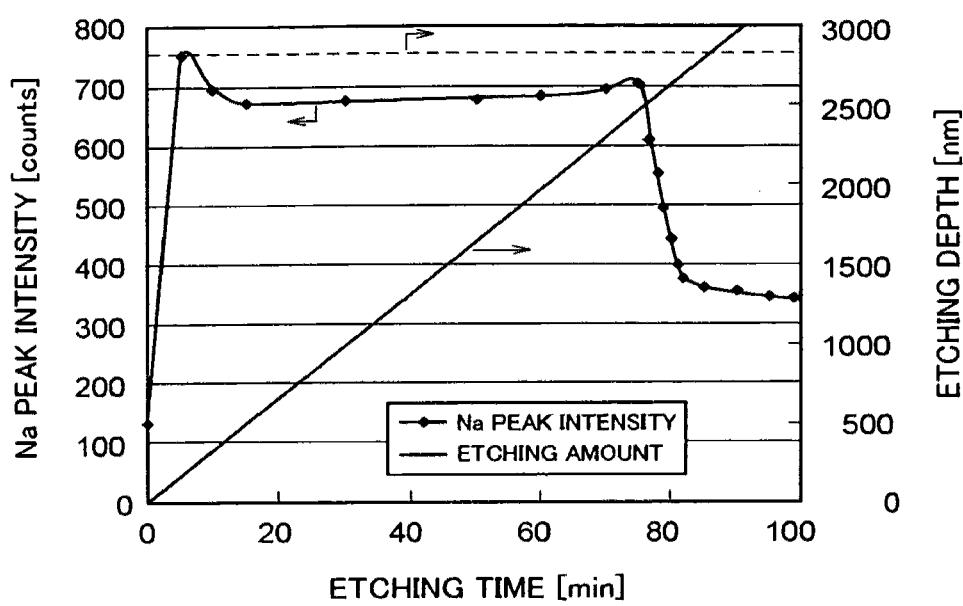
FIG. 3 is a graph showing a relationship between a Na emission peak intensity and an etching time.

FIG. 2 is a graph showing a time change of Na emission spectrum in dry etching. FIG. 3 is a graph showing a relationship between a Na emission peak intensity and an etching time.

The Inventors manufactured a lot of samples of the piezoelectric film wafer 1, each of which comprises the Pt bottom electrode layer 3 formed on the Si substrate 2 and the KNN piezoelectric film 4 formed on the Pt bottom electrode layer 3. Thereafter, the dry etching was carried out on the samples with using Ar, a mixed gas of Ar and $CHF_3$, or a mixed gas of Ar and $C_4F_8$, and the microprocessing characteristic was evaluated.

As a result, it was found that the time change of the emission peak intensity of Na in ion plasma during the etching process suddenly occurs in vicinity of an interface (boundary) between the KNN piezoelectric film 4 and the bottom electrode layer 3. The emission peak intensity of Na is observed during the dry etching process of the KNN piezoelectric film 4, and the emission peak intensity of Na decreases rapidly at the interface between the KNN piezoelectric film 4 and the bottom electrode layer 3.

The first embodiment is characterized by that the etching rate is changed by detecting the change in the emission peak intensity of Na in ion plasma emitted by the etching. For example, the etching stop is controlled by Ar alone. In the meantime, a value of attenuated state, in which the emission peak intensity of Na in ion plasma emitted by the etching suddenly attenuates from a steady-state value (i.e. a value of a steady state), is used for detecting the end (termination) of the etching of the piezoelectric film. In the example shown in FIGS. 1A to 3, the desired microprocessing can be accomplished by stopping the etching at the value of the attenuated state in which the emission peak intensity of Na is deteriorated to about 50% to 60%.

Herein, the steady-state value of the emission peak intensity of Na is the average value of emission peak intensities around ¼ to ¾ hours (the etching time from 20 minutes to 60 minutes in the graph shown in FIG. 3) before the emission peak intensity of Na begins to fall rapidly (the etching time of 80 minutes in vicinity of the end of precipitous down slope in the graph shown in FIG. 3).

It is important that the microprocessing of the KNN piezoelectric film 4 is carried out by the etching process for carrying out the dry etching with a gas containing Ar and the process of detecting the fall of the emission peak intensity of Na in the ion plasma emitted by the dry etching, while changing the etching rate by detecting the time change of the emission peak intensity of Na. In the process of changing the etching rate, referring to FIGS. 2 and 3, it is possible to stop the etching at the Pt bottom electrode layer 3 with a good controllability by detecting the rapid fall from the steady-state value during the etching process. According to this dry etching, it is possible to carry out the microprocessing of the KNN piezoelectric film 4 in a short time with high precision, and to carry out the processing such that a cross sectional shape of the etched portion is a taper shape which is gradually enlarged toward a surface of the Si substrate 2, namely, a trapezoidal shape which is upper-short-lower-long (i.e. an upper side is shorter than a lower side).

Figure 1B:
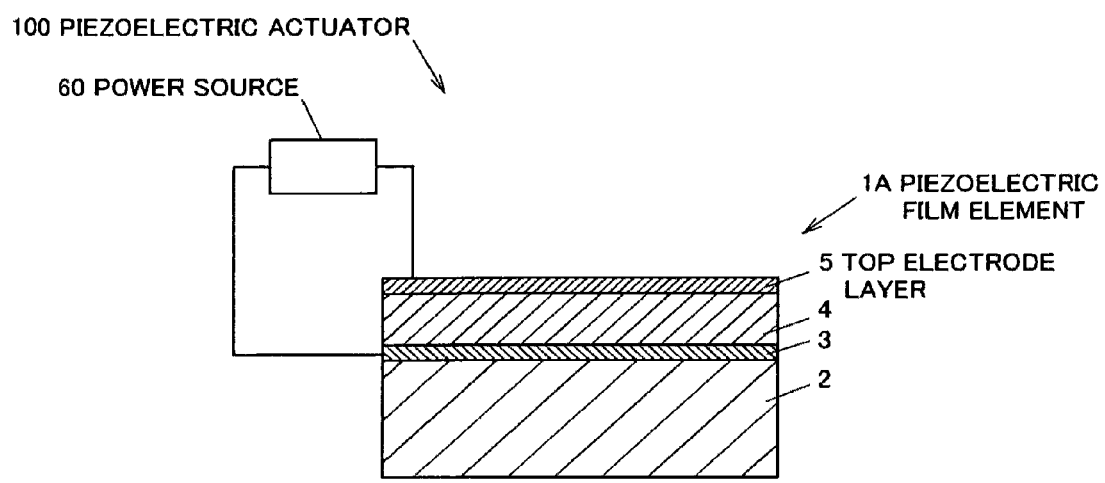
FIG. 1B is a cross sectional view schematically showing a piezoelectric actuator using a piezoelectric film element according to the present invention.
Figure 1C:
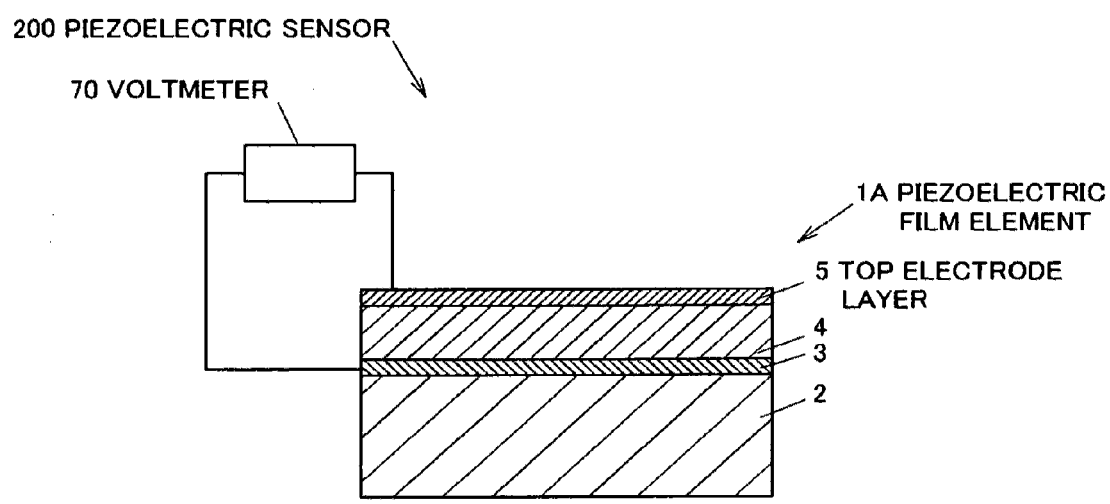
FIG. 1C is a cross sectional view schematically showing a piezoelectric sensor using the piezoelectric film element according to the present invention.

FIG. 1B is a cross sectional view schematically showing a piezoelectric actuator 100 using a piezoelectric film element according to the present invention. FIG. 1C is a cross sectional view schematically showing a piezoelectric sensor 200 using the piezoelectric film element according to the present invention. Referring to FIGS. 1B and 1C, a top electrode layer (upper electrode layer) 5 is provided on the KNN piezoelectric film 4. The upper electrode layer 5 may be formed after the microprocessing by the etching, or after removing the Ti film. To simplify the process, the upper electrode layer 5 may be formed on the KNN piezoelectric film 4 before the etching. In this case, the etching is carried out after forming a mask such as Ti on the upper electrode layer 5.

In FIG. 1B, a power source 60 as a voltage applying unit is connected to the upper electrode layer 5 and the lower electrode layer 3 of the piezoelectric element 1A to provide the piezoelectric actuator 100.

In FIG. 1C, a voltmeter 70 as a voltage detecting unit is connected to the upper electrode layer 5 and the lower electrode layer 3 of the piezoelectric element 1A to provide the piezoelectric sensor 200.

Second Embodiment

Figure 1D:
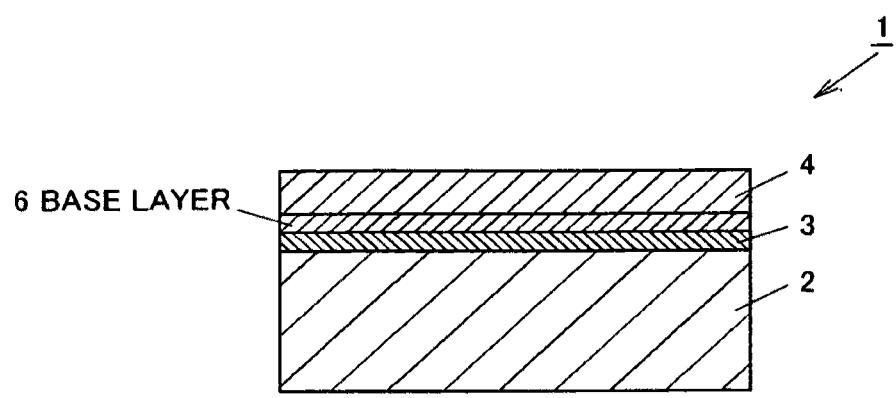
FIG. 1D is a cross sectional view schematically showing a piezoelectric film wafer in a second embodiment according to the present invention.

FIG. 1D is a cross sectional view schematically showing a piezoelectric film wafer 1 in a second embodiment according to the present invention. The piezoelectric film wafer 1 in the second embodiment is similar to the piezoelectric film wafer 1 in the first embodiment, except a base layer 6 is formed on the bottom electrode layer 3 (i.e. between the Pt bottom electrode layer 3 and the KNN piezoelectric film 4) so as to improve the adhesion between the Si substrate 2 and the Pt bottom electrode layer 3.

The base layer 6 is formed of a thin film of an alkali niobate-based perovskite structure represented by a composition formula $(K_{1-y}Na_y)NbO_3$ (also referred to as "dielectric base layer 6"). The composition ratio y is $0.7 < y \le 1.0$. The base layer 6 is formed to have a Na composition ratio higher than a Na composition ratio of the KNN piezoelectric film 4 to be formed on the base layer 6. The Na composition ratio may be constant, or may be varied continuously or in a step wise manner along a thickness direction of the base layer 6.

For example, a thickness of the base layer 6 may be from 20 nm to 120 nm. When the thickness of the base layer 6 is less than 20 nm, it is difficult to surely carry out the detection of the variation in the emission peak intensity. On the other hand, when the thickness of the base layer 6 is greater than 120 nm, the time required for film formation is increased and it is difficult to control the stop of etching.

It is preferable that the KNN piezoelectric film 4 formed on the base layer 6 has an orientation.

According to the structure of the piezoelectric film wafer 1 in the second embodiment, it is possible to further increase the detection sensitivity for the variation in the Na emission peak intensity, thereby improving the detection of the end of the etching. More concretely, when the etching progresses from the KNN piezoelectric film 4 to the base layer 6, the Na emission peak intensity is increased from the steady-state value. Thereafter, when all the base layer 6 is removed by the etching, the emission peak intensity of Na in ion plasma is remarkably increased. This phenomenon shows that the etching progresses from the base layer 6 to the Pt bottom electrode layer 3. This increase and decrease in the Na emission peak intensity can be used for detecting the end of etching of the KNN piezoelectric film 4.

EXAMPLES

Next, the piezoelectric film wafer according to the present invention will be explained more concretely in Examples, with referring to FIGS. 2 to 4 and TABLES 1 and 2. In the Examples, typical examples of the piezoelectric film wafer are explained, and the present invention is not limited thereto.

Formation of the Bottom Electrode Layer and the KNN Piezoelectric Film

As a substrate, a Si substrate 2 with a thermal oxidation film ((100) plane orientation, a thickness of 0.525 mm, a thickness of the thermal oxidation film of 200 nm, and a size of 4-inch wafer) was used. At the time of forming the Si substrate 2 by means of the RF magnetron sputtering method, a titanium (Ti) adhesion layer (not shown) was vapor-deposited between the Si substrate 2 and the Pt bottom electrode layer 3. In this example, the thickness of the adhesion layer was 10 nm. It is preferable that the thickness of the Ti adhesion layer was within a range from 1 nm to 30 nm. The Ti adhesion layer and the Pt bottom electrode layer 3 were formed under following condition: a substrate temperature of 100° C. to 350° C., an RF power of 200 W, Ar gas introduced atmosphere, a pressure of 2.5 Pa, and film formation time of 1 to 3 minutes and 10 minutes. In-plane surface roughness of the Pt bottom electrode layer 3 was measured, and the arithmetic mean surface roughness Ra was 0.86 nm or less. It was confirmed that the Pt bottom electrode layer 3 was oriented in (111) by X-ray diffraction measurement.

On the Pt bottom electrode layer 3, a $(K_{1-x}Na_x)NbO_3$ film was formed by the RF magnetron sputtering method. The $(K_{1-x}Na_x)NbO_3$ film (i.e. the KNN piezoelectric film 4) was obtained by forming a film using a sintered body of $(K_{1-x}Na_x)NbO_3$ (Na/(K+Na)=0.425 to 0.730) as a target under the following condition: a substrate temperature of 520° C., an RF power of 700 W, atmosphere of a mixture gas of $O_2$ and Ar with a $O_2$/Ar mixture ratio of 0.005, and a chamber pressure of 1.3 Pa. The film formation time of the KNN piezoelectric film 4 by the sputtering was adjusted such that the thickness of the KNN piezoelectric film 4 is about 3 μm.

Formation of Ti Pattern as Mask

Next, on the KNN piezoelectric film 4, a Ti film with a thickness of about 1.2 μm was formed by the RF magnetron sputtering method. Thereafter, a photoresist such as OFPR-800 (manufactured by Tokyo Ohka Kogyo Co., Ltd.) was coated on the KNN piezoelectric film 4, and the photoresist was exposed and developed to provide a photoresist pattern on the Ti film. Successively, the Ti film was etched by using the mixed solution of hydrofluoric acid and nitric acid (HF: $NHO_3$:$H_2O$=1:1:50), and the photoresist pattern was cleaned by acetone cleansing, to form a Ti pattern on the KNN piezoelectric film 4.

Herein, a thickness of the mask was determined with consideration of the etching selectivity (the ratio of the etching rate). In the present Examples, the method of measuring an amount (thickness) of the Ti film reduced by the etching and an amount (thickness) of the KNN film reduced by the etching was used. More specifically, after the dry etching using Ar gas or Ar-containing gas, the remained Ti pattern was removed by the mixed solution of hydrofluoric acid and nitric acid. Thereafter, a level difference was measured to calculate a depth of the etching. From the measurement result of the level differences before and after etching, the etching selectivity of KNN to Ti was derived. The etching selectivity "piezoelectric film thickness/mask thickness" was calculated from the etching depth obtained by measuring the level difference and the measurement result of the level difference before and after etching, and a maximum value thereof was about 3. Therefore, it is confirmed that the etching selectivity "piezoelectric film thickness/mask thickness" is preferably 3 or less for processing the KNN piezoelectric film 4.

Processing by Dry Etching

Next, the microprocessing was carried out on the KNN piezoelectric film 4 provided with the Ti mask pattern by the dry etching with using a gas containing Ar. In this process, by observing the time change of the emission peak intensity of Na in ion plasma, the processing was stopped at the bottom electrode layer 3 with a good controllability. For a dry etching device, an CCP-RIE (Capacitive Coupling Plasma-Reactive Ion Etching) apparatus (RIE-102L manufactured by Samco, Inc.) was used. For the reactive gas, Ar gas or a mixed gas of Ar and fluorine-based reactive gas such as $CHF_3$, $C_2F_6$, $CF_4$, $SF_6$, $C_4F_8$ may be used.

Observation of the Emission Peak Intensity of Na

In the process of the dry etching, the time change of the emission peak intensity of Na in ion plasma (hereinafter, also referred to as "Na peak intensity") was observed. The Na peak intensity was measured by using a spectrometer (USB 2000 manufactured by Ocean Optics, Inc.). The dry etching was carried out under the condition: RF output of 400 W, a chamber pressure of 33.3 Pa (0.25 Torr), and a gas total flow of 100 sccm. A KNN film having a thickness of 2830 nm was used.

FIG. 2 shows the emission spectrum within a wavelength range from 580 nm to 600 nm in the process of the dry etching. As clearly shown in FIG. 2, the emission intensity at a wavelength of 586 nm to 590 nm corresponding to a Na emission spectrum is decreased in accordance with the progress of the dry etching of the KNN piezoelectric film 4.

Measurement of the Etching Rate by the Dry Etching

The microprocessing was carried out on the KNN piezoelectric film 4 under the condition: RF (radio frequency) output of 400 W, a chamber pressure of 33.3 Pa (0.25 Torr), and a gas total flow of 100 sccm. The microprocessing was carried out by changing the gas composition and the mixture ratio. For detecting the end of the etching of the KNN piezoelectric film 4, a method for detecting the etching end by the time change in the peak intensity of Na in the ion plasma was used.

TABLE 1 shows the gas composition and the mixture ratio of the gas for dry etching and the relationship with the etching rate of the KNN piezoelectric film 4 when the gas composition and the mixture ratio are varied. As clearly understood from TABLE 1, the etching rate of 43 nm/min at maximum can be obtained by the dry etching (Reactive Ion Etching: RIE) using the Ar-containing gas.

TABLE 1

| Etching gas | Etching rate [nm/min] |
|---|---|
| Ar | 35 |
| Ar: $CHF_3$ = 99:1 | 23 |
| Ar: $CHF_3$ = 9:1 | 17 |
| Ar: $CF_4$ = 19:1 | 42 |
| Ar: $C_2F_6$ = 19:1 | 43 |
| Ar: $SF_6$ = 4:1 | 32 |
| Ar: $SF_6$ = 1:1 | 21 |
| Ar: $C_4F_8$ = 5:1 | 42 |
| Ar: $C_4F_8$ = 5:2 | 35 |
| Ar: $C_4F_8$ = 1:1 | 22 |

TABLE 2 shows Examples 1 to 10 in which the microprocessing is carried out on the KNN piezoelectric film 4 by changing the gas composition and the mixture ratio similarly to TABLE 1. In the Examples 1 to 7, a bias power is 0 W. In Examples 8 to 10, the bias power is 5 W. In each of Examples 1 to 10, the etching can be stopped at the bottom electrode layer 3 with good controllability.

TABLE 2

| | Etching gas | Etching time [min] | Slope angle [degrees] |
|---|---|---|---|
| Example 1 | Ar | 85 | 53.2 |
| Example 2 | Ar: $CHF_3$ = 99:1 | 130 | 51.7 |
| Example 3 | Ar: $CHF_3$ = 9:1 | 175 | 49.5 |
| Example 4 | Ar: $CF_4$ = 19:1 | 72 | 52.2 |
| Example 5 | Ar: $C_2F_6$ = 19:1 | 70 | 49.9 |
| Example 6 | Ar: $SF_6$ = 4:1 | 94 | 46.1 |
| Example 7 | Ar: $SF_6$ = 1:1 | 143 | 47.3 |
| Example 8 | Ar: $C_4F_8$ = 5:1 | 71 | 54.9 |
| Example 9 | Ar: $C_4F_8$ = 5:2 | 86 | 60.1 |
| Example 10 | Ar: $C_4F_8$ = 1:1 | 136 | 63.5 |

FIG. 3 shows a relationship between the etching time and the Na emission peak intensity at a wavelength of 588.5 nm corresponding to a center wavelength of an emission spectrum of Na in ion plasma. Referring to FIG. 3, a right axis of a graph indicates an estimated value of the etching depth obtained from the etching rate shown in TABLE 1 and the thickness of the KNN piezoelectric film 4 (indicated by a dotted line in FIG. 3). As clearly understood from FIG. 3, the Na emission peak intensity greatly falls from the steady-state value before etching out the KNN piezoelectric film 4 by dry etching in a vicinity of the etching out (precipitous down slope at the right side in the graph in FIG. 3). The attenuation (fall) of the Na emission peak intensity can be used for detecting the end of the etching of the KNN piezoelectric film 4.

In addition to the above observation of the Na emission peak intensity, it is possible to easily stop the processing at the Pt bottom electrode layer 3 with more security, by using the Pt bottom electrode layer 3 having the ratio "KNN piezoelectric film (piezoelectric film thickness)/Pt bottom electrode layer (Pt film thickness)" of 15 or less. The ratio "Piezoelectric film thickness/Pt film thickness" is set to be 15 or less, so as to suppress the insufficient etching or over-etching in a plane of a large diameter wafer. In this Example, since it is appropriate to stop the processing after etching the Pt bottom electrode layer 3 for 100 nm, the Pt bottom electrode layer 3 has a thickness of 210 nm while the thickness of the KNN piezoelectric film 4 is 3 μm. When configuring a device with a pressurized piezoelectric film element, the Pt bottom electrode layer exposed by the etching may be used as a pad for applying a voltage or detecting the voltage. In such a case, it is preferable to determine each film thickness or each etching selectivity previously such that the thickness of the bottom electrode layer exposed after the etching is 80 nm or more, preferably 100 nm or more.

In addition, the etching rate was observed by varying the chamber pressure of the Ar gas from 20 to 66.7 Pa (from 0.15 to 0.50 Torr). It is confirmed that the difference in the etching rate was around 20%, and that the etching rate was the maximum when the chamber pressure is 33.3 Pa (0.25 Torr). The same tendency was observed when using the fluorine-based reactive gas other than $CHF_3$, e.g. $C_2F_6$, $CF_4$, $SF_6$, $C_4F_8$.

As clearly understood from FIG. 3 and TABLE 2, it is necessary to carry out the dry etching process using the Ar gas or the mixed gas of Ar and the fluorine-based reactive gas such as $CHF_3$, $C_2F_6$, $CF_4$, $SF_6$, $C_4F_8$, for carrying out the microprocessing on the KNN piezoelectric film 4 in a short time with high precision. Further, it is preferable to detect the time change of the emission peak intensity of Na in ion plasma for stopping the etching at the bottom electrode layer 3 comprising Pt or the like. However, in the case of the ratio of the reactive gas to Ar is high, since the KNN etching rate tends to fall greatly, it is necessary to adjust the ratio of Ar and the reactive gas with much attention. More specifically, when the mixture ratio of Ar gas/reactive gas is smaller than 1, the etching rate of the KNN piezoelectric film 4 falls greatly, so that it is not suitable for the actual microprocessing. Therefore, the mixture ratio of Ar gas/reactive gas is set to be preferably 1 or more, more preferably 2.5 or more.

Stop of the Microprocessing and the Etching

Figure 4:
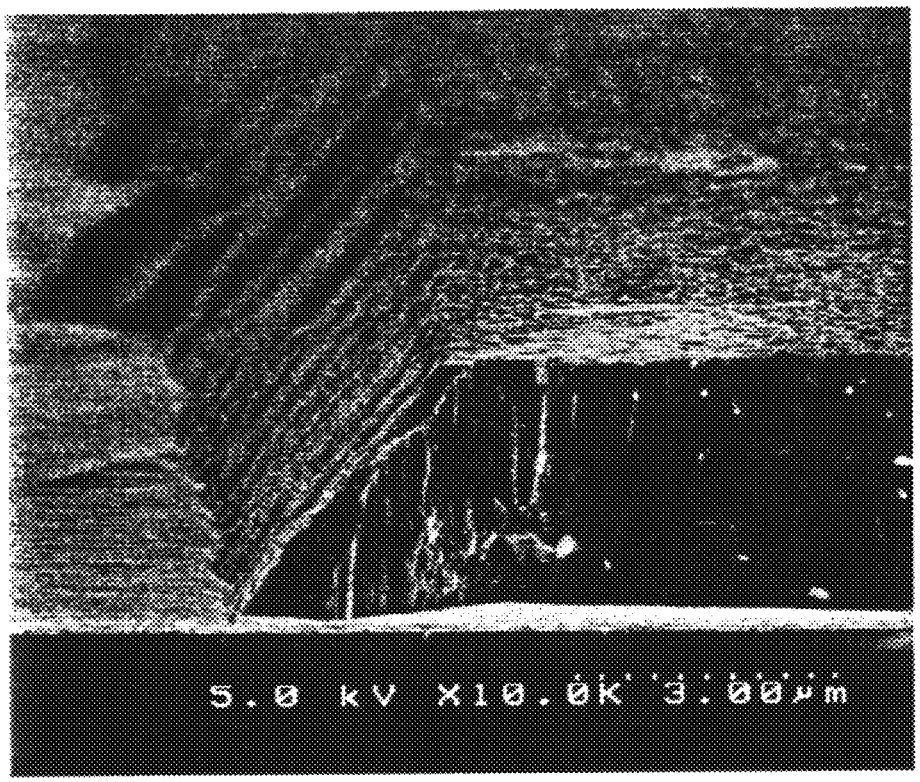
FIG. 4 is a SEM (Scanning Electron Microscopy) image showing a cross section of a KNN piezoelectric film after microprocessing by dry etching.

FIG. 4 shows a cross sectional SEM image of the piezoelectric film wafer 1 after the microprocessing in Example 1. As clearly understood from FIG. 4, it is possible to remove the KNN piezoelectric film 4 and stop the etching at the Pt bottom electrode layer 3, by combining the step of carrying out the microprocessing on the KNN piezoelectric film 4 by the dry etching using the Ar-containing gas, and the process of stopping the processing at the Pt bottom electrode layer 3 with good controllability by detecting the change in the emission peak intensity of Na in ion plasma.

In the cross section of the etched portion (i.e. etching cross section) of the KNN piezoelectric film 4 after the microprocessing, a tapered inclined portion which is enlarged toward the outside is formed as shown in FIG. 4. The inclined portion has a trapezoidal cross section which is upper-short-lower-long (i.e. an upper side is shorter than a lower side). An angle θ made by a slope connecting an upper surface edge and a bottom surface edge of the KNN piezoelectric film 4 and a bottom surface of the KNN piezoelectric film 4 is a slope angle θ (hereinafter, also referred to as "taper angle θ") which is greater than 45° and smaller than 90°. A surface of the inclined portion contains a fluorine compound.

The taper angle θ of the KNN piezoelectric film 4 can be controlled to be within a range greater than 45° and smaller than 90° by changing the bias power. In Examples 9 and 10 shown in TABLE 2, the taper angle θ of 65° to 70° can be obtained in the KNN piezoelectric film 4 by carrying out the microprocessing while controlling the bias power within a range from 12 W to 15 W. The taper angle θ of the KNN piezoelectric film 4 can be controlled to be within 85° to 90° by increasing the bias power to 150 W.

Further, it is confirmed that it is possible to improve the controllability of the taper angle θ to be within the range from 45° to 90°, by controlling a chamber pressure as well as the bias power. For example, it is confirmed that the taper angle θ of the KNN piezoelectric film 4 can be increased by controlling the chamber pressure to be lowered. In Example 8, the bias power is 5 W. For example, it is possible to control the taper angle θ of the KNN piezoelectric film 4 to be 70°, by setting the chamber pressure to be 6.67 Pa (0.05 Torr).

When the taper angle θ of the KNN piezoelectric film 4 is 45° or less, the precision of the microprocessing of the KNN piezoelectric film 4 is deteriorated, so that the piezoelectric film element cannot exhibit the characteristics as designed. Therefore, it is not preferable that the taper angle θ is 45° or less. On the other hand, when the taper angle θ of the KNN piezoelectric film 4 is 90° or more, the etching cross section of the KNN piezoelectric film 4 has an inverted trapezoidal shape that is upper-long-lower-short (i.e. an upper side is longer than a lower side). It is not preferable since the structure is unstable, and the stability and reliability are insufficient, so that the yield at the dry etching process falls.

A cantilever type actuator was formed by using the piezoelectric film element 1A in which the slope angle θ of the KNN piezoelectric film 4 is controlled to be greater than 45° and less than 90°. The operation of the actuator was observed by applying an operating voltage of 20V. As a result, there was no problem in the stability or reliability of the operation (i.e. a deterioration rate after operations for one hundred million times). Therefore, it is confirmed that the KNN piezoelectric film element using the KNN piezoelectric film 4 in the embodiment is suitable for the piezoelectric film device.

Variations

The piezoelectric film wafer of the present invention is explained with referring to the embodiments and Examples of the present invention, however, the present invention is not limited thereto. As clearly understood from the above description, the present invention can be embodied in various embodiments without going beyond its scope. For example, following variations may be embodied.

First Variation

Processing of the KNN Piezoelectric Film Formed by a Sol-Gel Method

In the case of forming a piezoelectric film by a sol-gel method or MOD (Metal Organic Deposition) method, a coating layer is formed by using precursor liquid in which a composition ratio of the material is adjusted to provide a desired composition formula, and the coating layer is crystallized, to provide the piezoelectric film. For example, a sodium ethoxide is used as an organometallic compound containing Na, potassium ethoxide is used as an organometallic compound containing potassium, and niobium ethoxide is used as an organometallic compound containing niobium, and these materials are mixed to provide a desired mole ratio. Thereafter, the mixed material is dissolved and dispersed by using an organic solvent such as ethyl alcohol, to manufacture the precursor solution.

In the first variation, the precursor solution manufactured by mixing the potassium ethoxide, sodium ethoxide, and niobium ethoxide at the predetermined mole ratio is coated by a spin coat method on a Nb-doped SrTiO$_3$ substrate, then, dried and partially baked (sintered) on a hot plate. Thereafter, an annealing process is carried out at a temperature of 700° C. This process is repeated to obtain a required film thickness, thereby forming a KNN piezoelectric film having a film thickness of 4 μm.

A Ta film having a film thickness of 1.5 μm is formed as a mask on the KNN piezoelectric film formed by the sol-gel method. Thereafter, the microprocessing of the present invention was carried out on the KNN piezoelectric film. The etching can be stopped at a surface of the substrate. Further, the taper angle θ of the inclined portion of the piezoelectric film thus obtained is within the range similar to that in the above embodiment, can be controlled by adjusting the bias power and the chamber pressure.

Second Variation

Processing of a KNN Piezoelectric Film Formed by AD Method

Next, the microprocessing on a KNN piezoelectric film formed by aerosol deposition method (AD method) is examined. The KNN piezoelectric film is formed by using material powders with the same composition ratio as the composition of a desired KNN piezoelectric film as a main material and a helium gas as a carrier gas. In addition, a crystalline powder of a dielectric material which is easily formed by the aerosol deposition method may be mixed as an auxiliary material. Around 3 to 10% by weight ratio of the auxiliary material such as $Al_2O_3$ may be added to the main material, so as to increase a film density.

In the second variation, KNN film material powders with the same composition ratio as the composition of a desired KNN piezoelectric film is prepared. In addition, $Al_2O_3$ is mixed as the auxiliary material with the KNN film powder. More specifically, a material in which $Al_2O_3$ is mixed as the auxiliary material with potassium sodium niobate crystal powder "K:Na:Nb:O=7.5:6.5:16:70 (% by atom number) as the main material, is used. Spray coating is carried out on a substrate provided with a bottom electrode by using He carrier gas at a substrate temperature of 500° C. to form a KNN piezoelectric film having a thickness of 10 μm. A MgO substrate is used as the substrate and a Pt layer having a thickness of 500 nm is used as the bottom electrode.

A W (tungsten) film having a film thickness of 3.0 μm is formed as a mask on the KNN piezoelectric film formed by the AD method. Thereafter, the microprocessing of the present invention was carried out on the KNN piezoelectric film. The etching can be selectively stopped at the Pt layer similarly to the piezoelectric film formed by the sputtering method. Further, the taper angle θ of the inclined portion of the piezoelectric film thus obtained is within the range similar to that in the above embodiment. Further, the taper angle θ can be controlled by adjusting the bias power and the chamber pressure.

Other Variations

In the above embodiment or Examples, the gas containing Ar is used. However, the present invention is not limited thereto. The same effect as that of the gas containing Ar can be obtained by using the gas containing $O_2$ or $N_2$.

Referring again to TABLE 1, it is possible to carry out the processing at the etching rate higher than 40 nm/min depending on the type of the etching gas or the mixture ratio of the etching gas. Depending on the thickness of the piezoelectric film, the mixed quantity (the mixture ratio) of the fluorine-based reactive gas may be controlled such that the etching rate is lowered. For example, when the film thickness of the KNN piezoelectric film 4 is less than 1 μm, there may be uneven etched portions (e.g. over-etching, insufficient-etching) in a part of the plane of the KNN piezoelectric film 4. As to the etching in Example 8, it is supposed that the reaction was too rapid for the KNN piezoelectric film 4 having the film thickness less than 1 μm. Therefore, in Example 9, the amount of $C_4F_8$ was increased so as to control the etching rate.

Further, in the case that the film thickness of the piezoelectric film 4 is from 200 nm to 500 nm, it is possible to carry out the etching with good controllability, by the reactive ion etching with the use of the mixture gas in which the mixture ratio of the Ar gas and the fluorine-based reactive ion gas is 1:1. By controlling the flow of the etching gas, it is possible to improve the detection of the time change of the Na emission peak intensity and the controllability of the etching. Therefore, even though the film thickness of the piezoelectric film 4 is less than 1 μm, it is possible to achieve the desired microprocessing.

For the base layer, $LiNbO_3$ or $KNbO_3$ may be used other than Pt. It is also possible to provide a multilayer structure in which a $KNbO_3$ film is formed as the base layer on the Pt bottom electrode layer 3.

The embodiment and Examples show an example in which the condition for stopping the etching is determined appropriately based on the etching rate shown in TABLE 1 when the fall of 50% to 60% of the steady-state value is detected. However, the present invention is not limited thereto. The condition for stopping the etching can be varied in accordance with the other etching conditions. For example, it is possible to control the flow of the etching gas to increase the ratio of the fluorine-based reactive gas, when the fall of 20% to 40% of the steady-state value is detected. By controlling the flow of the etching gas to lower the etching rate and to increase the etching selectivity of the KNN piezoelectric film to the Pt film, it is possible to stop the selective etching at the Pt bottom electrode layer, thereby carrying out the microprocessing with higher precision.

Further, it is also possible to control the shape of the inclined portion by controlling the bias power during the etching process. Still further, it is possible to process the KNN piezoelectric film 4 into a desired shape by combining the aforementioned Examples appropriately.

The trapezoidal cross section structure of the KNN piezoelectric film 4 after the microprocessing may be configured as a cross section structure having a semi-circular arc shape curved upwardly or downwardly with respect to the slope of the KNN piezoelectric film 4.

In the above embodiment, the Ti adhesion layer is formed as an example. Ta may be used instead of Ti, and the same effect as that of the Ti adhesion layer can be obtained. In the aforementioned Examples, the film thickness of the Ti adhesion layer is within the range from 1 nm to 30 nm. The Ti adhesion layer may be formed to have a thickness greater than 30 nm, as a layer for preventing the substrate from exposure. For example, in some cases, the film thickness of the Pt bottom electrode layer should be less than 100 nm in accordance with the device to be applied. In such a case, it is preferable to control the mixture ratio of the reactive gas, thereby controlling the etching selectivity of the KNN piezoelectric film to the Pt bottom electrode layer, so as to prevent the substrate from exposure due to the over-etching of the Pt bottom electrode layer. For this case, it is possible to prevent the substrate from exposure due to the over-etching by providing a Ti layer having a thickness of 50 nm between the substrate and the Pt bottom electrode layer.

In the embodiment and Examples, although the (001) plane Si substrate 2 with a thermally-oxidized film (001) is used as the substrate, it is possible to provide the same effect as that in the embodiment by using a Si substrate with different plane orientation, a Si substrate without thermally-oxidized film, or a SOI (Silicon-On-Insulator) substrate. Further, instead of the Si substrate, a quartz substrate, a GaAs substrate, a sapphire substrate, a metallic substrate such as stainless substrate, a MgO substrate, or a $SrTiO_3$ substrate, a piezoelectric substrate may be used.

In the embodiment and Examples, although the KNN piezoelectric film 4 is not doped with other elements in the embodiment, the KNN piezoelectric film 4 may be doped with 5% or less by atom number of Li (lithium), Ta, Sb (antimony), Ca (calcium), Cu (copper), Ba (barium), Ti and the like.

In the aforementioned Examples, a 4-inch wafer is used. However, the present invention is not limited thereto. A wafer of 4 inches or more, e.g. a 6-inch wafer may be used.

As described above, by using the method for manufacturing a piezoelectric film wafer 1 having a small environmental burden, it is possible to provide a piezoelectric sensor or an piezoelectric actuator. The actuator using the piezoelectric film element may be used for an inkjet printer head, a scanner, an ultrasonic generator, and the like. The sensor using the piezoelectric film element may be used for a gyro sensor, an ultrasonic sensor, a pressure sensor, a speed sensor, an acceleration sensor.

Other than the actuator and the sensor, it is possible to obtain a piezoelectric film element which can be applied to a filtering device, or a MEMS device. Further, it is possible to manufacture a piezoelectric film device provided with a voltage detecting means or a voltage applying means with the reliability similar to that of the conventional device and the less expensive manufacturing cost.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A method for manufacturing a piezoelectric film wafer, said method comprising:
   an etching for carrying out a dry etching on a piezoelectric film formed on a substrate by using a gas, the piezoelectric film comprising an alkali niobate-based perovskite structure expressed in a composition formula $(K_{1-x}Na_x)NbO_3$ (0.4≤x≤0.7); and
   changing a rate of the dry etching by detecting a change in an emission peak intensity of Na in emitted ion plasma,
   wherein the gas comprises a mixed gas of Ar and a fluorine-based reactive gas,
   wherein the piezoelectric film is formed on a Pt bottom electrode layer,
   wherein the dry etching is stopped at a value of an attenuated state in which the emission peak intensity of Na is deteriorated to about 50% to 60% of a steady-state value of the emission peak intensity of Na, the steady-state value being an average value of emission peak intensities of NA in a range from ¼ hours to ¾ hours before the emission peak intensity of Na begins to fall more rapidly than drops of the emission peak intensity of Na within the range from ¼ hours to ¾ hours, and
   wherein said stopping the dry etching comprises detecting an attenuation change in an emission peak intensity of a Na emission spectrum within a range from 586 nm to 588.5 nm in the ion plasma.

2. The method for manufacturing a piezoelectric film wafer according to claim 1, wherein a fall of the emission peak intensity of Na is detected and a time the change in the emission peak intensity of Na is detected.

3. The method for manufacturing a piezoelectric film wafer according to claim 1, wherein the changing the rate of the dry etching comprises stopping the dry etching selectively in a base layer formed between the substrate and the piezoelectric film.

4. The method for manufacturing a piezoelectric film wafer according to claim 3, wherein the base layer comprises the Pt bottom electrode layer.

5. The method for manufacturing a piezoelectric film wafer according to claim 1, wherein the etching includes a reactive ion etching using the mixed gas of Ar and the fluorine-based reactive gas.

6. The method for manufacturing a piezoelectric film wafer according to claim 1, wherein a mask pattern comprising Ti or Ta is formed on the piezoelectric film, and the etching is carried out by using the mask pattern.

7. The method for manufacturing a piezoelectric film wafer according to claim 6, wherein a ratio of a film thickness of the piezoelectric film to a film thickness of the mask pattern is greater than 0 and not greater than 3, and a ratio of the film thickness of the piezoelectric film to a film thickness of the Pt bottom electrode layer of the base layer is greater than 0 and not greater than 15.

8. The method for manufacturing a piezoelectric film wafer according to claim 1, wherein the change in the emission peak intensity of Na comprises an attenuation change in the emission peak intensity of a Na emission spectrum in the ion plasma.

9. The method for manufacturing a piezoelectric film wafer according to claim 1, wherein the etching comprises carrying out microprocessing on the piezoelectric film by the dry etching, the microprocessing comprising processing the piezoelectric film to have a taper shape which is gradually enlarged toward a surface of the substrate at an etching cross section of the piezoelectric film.

10. The method for manufacturing a piezoelectric film wafer according to claim 9, wherein the processing of the piezoelectric film comprises stopping the dry etching at a bottom electrode formed between the substrate and the piezoelectric film.

11. A method for manufacturing a piezoelectric film element, said method comprising:
    forming a bottom electrode on a substrate;
    forming a piezoelectric film comprising an alkali niobate-based perovskite structure expressed in a composition formula $(K_{1-x}Na_x)NbO_3$ ($0.4 \leq x \leq 0.7$) on the substrate; and
    carrying out microprocessing on the piezoelectric film by dry etching using a gas, the microprocessing comprising processing the piezoelectric film to have a taper shape which is gradually enlarged toward a surface of the substrate at an etching cross section of the piezoelectric film by stopping processing at the bottom electrode by detecting an attenuation change in an emission peak intensity of a Na emission spectrum within a range from 586 nm to 588.5 nm in ion plasma,
    wherein the gas comprises a mixed gas of Ar and a fluorine-based reactive gas,
    wherein the piezoelectric film is formed on a Pt bottom electrode layer, and
    wherein the dry etching is stopped at a value of an attenuated state in which the emission peak intensity of Na is deteriorated to about 50% to 60% of a steady-state value of the emission peak intensity of Na, the steady-state value being an average value of emission peak intensities of NA in a range from ¼ hours to ¾ hours before the emission peak intensity of Na begins to fall more rapidly than drops of the emission peak intensity of Na within the range from ¼ hours to ¾ hours.

12. The method for manufacturing a piezoelectric film element according to claim 11, wherein said forming the bottom electrode comprises disposing the bottom electrode on an upper surface of the substrate.

13. The method for manufacturing a piezoelectric film element according to claim 12, wherein said forming the piezoelectric film comprises disposing the piezoelectric film on an upper surface of the bottom electrode.

14. The method for manufacturing a piezoelectric film element according to claim 11, wherein the dry etching includes a reactive ion etching using the mixed gas of Ar and the fluorine-based reactive gas.

* * * * *